United States Patent [19]

Takahashi et al.

[11] Patent Number: 4,954,706
[45] Date of Patent: Sep. 4, 1990

[54] RADIOGRAPHIC IMAGE PICKUP APPARATUS

[75] Inventors: Tetsuhiko Takahashi, Tokyo; Kenichi Okajima, Hoya; Hiroshi Takeuchi, Matsudo, all of Japan

[73] Assignee: Hitachi, Ltd., Tokyo, Japan

[21] Appl. No.: 330,495

[22] Filed: Mar. 30, 1989

Related U.S. Application Data

[63] Continuation-in-part of Ser. No. 181,694, Apr. 14, 1988.

[30] Foreign Application Priority Data

Apr. 1, 1988 [JP] Japan ............................ 63-78009

[51] Int. Cl.$^5$ .................................................. G03B 42/00
[52] U.S. Cl. ............................... 250/327.2; 250/484.1; 250/213 R
[58] Field of Search .............. 250/327.2, 484.1, 213 R

[56] References Cited

U.S. PATENT DOCUMENTS

| | | | |
|---|---|---|---|
| 3,010,025 | 11/1961 | Bramley et al. | 250/213 R |
| 3,911,423 | 10/1975 | Arndt et al. | 250/213 R X |
| 4,268,750 | 5/1981 | Cowart | 250/315.3 |
| 4,535,468 | 8/1985 | Kempter | 250/327.2 X |
| 4,554,453 | 11/1985 | Feigt et al. | 250/213 R X |
| 4,727,427 | 2/1988 | Kime | 358/211 X |
| 4,734,581 | 3/1988 | Hashiue | 250/327.2 |
| 4,736,234 | 4/1988 | Boulitrop et al. | 357/30 |

Primary Examiner—Constantine Hannaher
Assistant Examiner—J. Eisenberg
Attorney, Agent, or Firm—Antonelli, Terry, Stout & Kraus

[57] ABSTRACT

A radiographic image pickup apparatus for diagnosis using an image detector in which a phosphor layer for converting an X-ray image into an optical image, a photoconductive layer for storing an optical image as a latent image, light-emitting means for exciting the photoconductive layer segment by segment are laminated into a plate form, wherein one of the electrodes sandwiching the photoconductive layer and the light-emitting means are respectively divided into array-formed elements in directions orthogonal to each other, and an element selection circuit for successively selecting these elements and reading out said latent image in time sequential electric signal is formed integrally on the substrate of the image detector.

6 Claims, 9 Drawing Sheets

RADIOGRAPHIC IMAGE PICKUP APPARATUS

CROSS REFERENCE TO THE RELATED APPLICATION

This application is a continuation-in-part application of U.S. patent application, Ser. No. 181,694 filed on Apr. 14, 1988.

BACKGROUND OF THE INVENTION

1. FIELD OF THE INVENTION

This invention relates to an image pickup apparatus adapted for use in medical radiodiagnostics, and more particularly to a plate-shaped image pickup device for receiving a radiographic image and transforming the image into an electric signal sequence.

2. DESCRIPTION OF THE RELATED ART

U.S. Pat. No. 4,535,468 discloses a photographic apparatus for medical use with a three-layer system lying between two electrodes, to which a d-c voltage is applied. The two outer layers are photoconductors and the middle layer consists of a material in which charge carriers can be stored. An image radiated from one side can be read out from the other side in the form of an electric pulse sequence by scanning using a light beam and can be reproduced on a television screen.

U.S. Pat. No. 4,268,750 discloses an analogous photographic apparatus having a multi-layer detector including only one photoconductive layer.

The detector of these apparatuses has a pair of parallel plate electrodes sandwiching the photoconductive layer and one signal line connected thereto. The latent image once stored in the detector in the form of a charge distribution is read out as a time sequential signal by scanning a spot-shaped laser beam.

In the solid state image pickup elements, i.e. photographic sensors such as CCD cameras or MOS image pickup devices, electronic pixel selection means is adopted. This selection means is integrated on the one-chip semiconductor substrate together with the pixels. These image pickup devices, however, have extremely low sensitivity to the X ray for medical use range, and hence cannot be directly used as the X ray image pickup apparatus for medical use. Further, the image pickup apparatus for medical use requires a number of pixels as many as $4000^2$ at the maximum and an image plane size as wide as 40 cm $\times$ 40 cm at the maximum. Thus, the techniques of the above-mentioned photographic image pickup devices (typically, having a number of pixels around $600^2$ and an image plane size of 2 inches $\phi$ or less) cannot be used.

SUMMARY OF THE INVENTION

In the above-mentioned prior art, the capacitance formed between the two electrodes connected to a signal line is large and hence results in a lowering of the signal-to-noise ratio. Further, the mechanism of scanning a laser beam on a image pickup field forms a large factor of making the device big and complicated.

An object of this invention is to provide a radiographic image pickup apparatus which suppresses the mixing of noise into the time sequential electric signals.

Another object of this invention is to provide a radiographic image pickup apparatus having electronic pixel selection means compactly integrated with the detector, thereby raising the reliability and largely reducing the cost.

A of this invention includes dividing one of the electrodes sandwiching the photoconductive layer into array form, providing selection means for successively selecting the divided electrodes one by one, and forming this selection means on the substrate of the detector by stacking layers using thin film technology.

DESCRIPTION OF THE PREFERRED EMBODIMENTS

Now, description will be made, referring to FIGS. 1 and 2.

Figure 1:
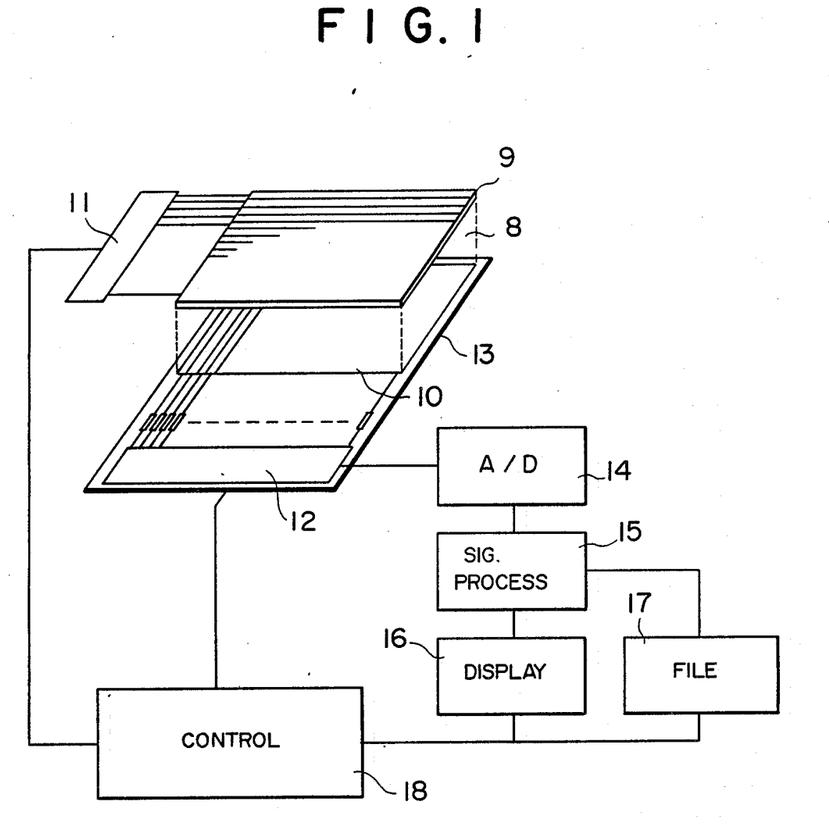
FIG. 1 is a block diagram of the general construction of an embodiment of this invention.

FIG. 1 is a conceptual diagram of the whole radiographic image pickup apparatus. A radiographic image storing unit 8 has typical dimensions of 40 cm $\times$ 40 cm. This is an image plane size required for diagnosing the breast. This radiographic image storing unit 8 includes a photoconducting layer and is in close optical contact with a phosphor plate (not shown). The X ray image is converted into a light image by the phosphor plate. The image storing unit 8 stores charge distributions corresponding to the light image as a latent image. Further, on the image storing unit 8, an exciting unit 9 and a reading unit 10 are laminated. The exciting unit 9 and the signal reading unit 10 have respectively one dimensional disposition and are orthogonal to each other. Designation of a position on an image plane is performed by the combination of the respective addresses of the exciting unit 9 and the reading unit 10. These channel designations are done by channel designation units 11 and 12. The signal from the reading unit 10 is successively A/D converted in an A/D converter 14 while being controlled by the channel designation unit 12. This signal is processed by a signal processing unit 15, displayed in an image display unit 16, and stored in an image file unit 17. Numeral 18 denotes a control unit for controlling the various units.

Figure 2:
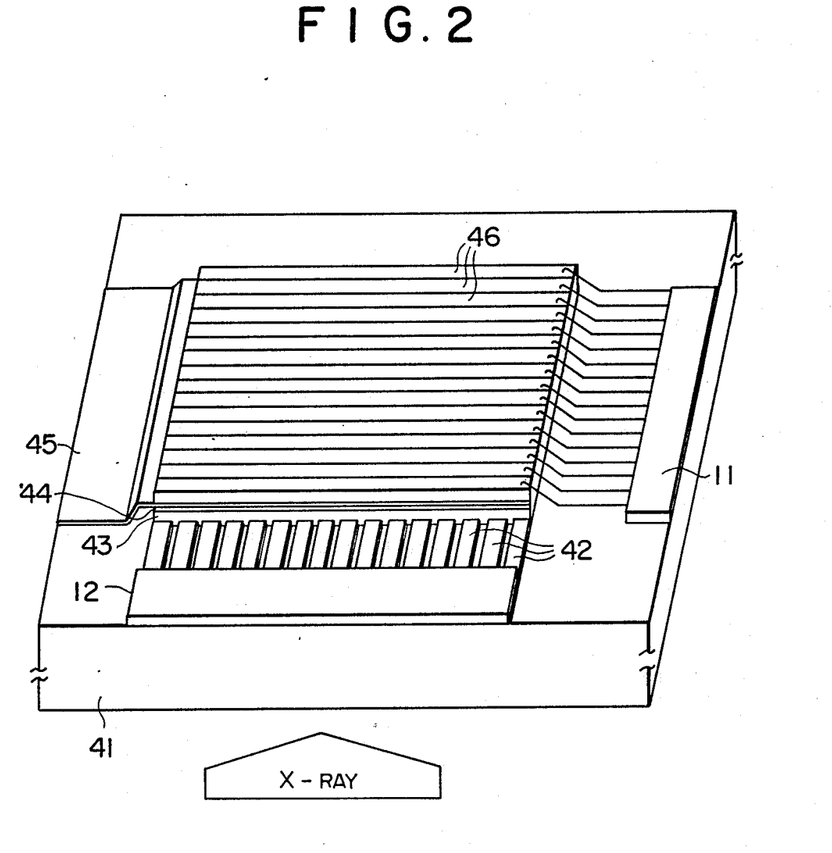
FIGS. 2 and 3 are a perspective view and a plan view showing a main part of the embodiment.

FIG. 2 shows details of an example of the radiographic image storing unit 8, the exciting unit 9, and the reading unit 10. Firstly, the structure will be explained. A phosphor plate 41 is a ceramic scintillator formed, for example, of $CdWO_4$ or $Gd_2O_2S$ and serves also as a substrate 13 which is shown in FIG. 1. On the phosphor plate 41, are laminated an electrode layer 42, a photoconductive layer 43, an insulating layer 44, and another electrode layer 45. The photoconductive layer 43 is formed, for example, of a layer of amorphous selenium (a-Se) or a laminate of a-Se/a-Si, of for example 2 $\mu$m thickness. This corresponds to the above-mentioned storing unit 8. The pair of electrodes 42 and 45 sandwiching the photoconductive layer 43 are formed of transparent conductive material, for example $SnO_2$, ITO (indium-tin-oxide), $SnO_2$/ITO or Au. The electrode layer 42 on the substrate side is divided into one-dimensional array electrodes. FIG. 2 shows an example in which 16 channel electrodes are disposed in an array form. In a preferable disposition for medical radiographic diagnosis, the channel width is 100 μm, and the number of channels is 4096. These array-form electrodes correspond to the reading unit 10 in FIG. 1.

The insulating layer 44 is formed, for example, of $Sb_2S_3$, $CeO_2$, SiO, $SiO_2$, MgF or an organic insulating film. On the electrode layer 45, are provided stripe shaped light-emitting material rows 46 which are disposed perpendicular to the electrodes 42. These correspond to the exciting unit 9 of FIG. 1. The light emitting material 46 may be formed of an EL (electroluminescent) light-emitting material or a plane-light-emitting LED (light emitting diode). Although the figure shows 16 light-emitting material rows, in a preferable disposition for medical radiographic diagnosis, 4096 stripe-shaped light-emitting material rows, each having a channel width of 100 μm are disposed. In the case of the number of electrodes being 4096 and the number of light-emitting material rows being 4096, the vertical and the horizontal lengths of the image plane sensor and 40.96 cm and the spatial resolution is 5 lp/mm. In the present structure, the X ray image is irradiated on part of the rear surface of the phosphor plate 41, more specifically on a region corresponding to the region where the photoconductive layer 43 is formed. Therefore, the X ray is not irradiated on the channel designation units 11 and 12.

Next, the operation principles will be explained. First, a voltage V is applied between all the elements of the electrode 42 and the electrode 45, causing all the elements of the light-emitting material unit 46 to emit lights. By this action, charge is uniformly induced at the interface formed between the photoconductive layer 43 and the insulating layer 44. Then, the light-emitting elements are turned off to terminal the excitation. Then, a voltage-V' having the opposite polarity to that of the previously applied voltage is applied between the electrodes. In this state, an X ray image is injected to the phosphor layer 41. The X ray image is converted into a light image by the phosphor layer 41. This light image transmits the transparent electrode 42 and is incident on the photoconductive layer 43. At this moment, the previously induced charge is discharged in accordance with the amount of incident light. As a result, a charge pattern reflecting the incident X ray image is formed at the interface between the photoconductive layer 43 and the insulating layer 44. This is the latent image. After the termination of irradiation of X ray, the reading of the latent image is performed. For this purpose, one of the light-emitting segments 46 is designated by the channel designating unit 11 to emit light. In this state, a voltage V identical to the firstly applied voltage is applied between one of the electrodes 42 and the electrode 45. Here, in a small area (one picture element) where a selected light-emitting segment and a selected electrode cross to each other, the charge flowing from the electrode 42 to the photoconductive layer 43 is equal to the amount of charge discharged upon irradiation of the X ray image and hence represents the image information of the picture element. By the successive selection of the electrodes 42, the image information for one line is successively read out. Then, the selection of the light-emitting element 46 is changed and similar scanning is successively performed to read out the X ray image as time sequential electric signals.

Figure 3:
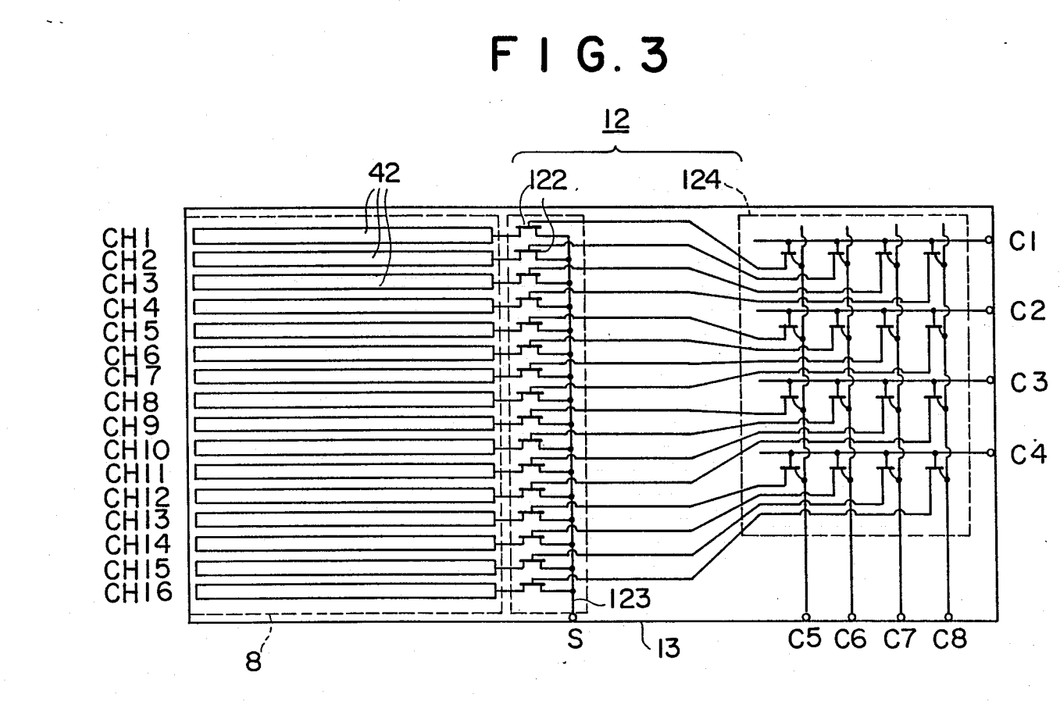

Next, the signal reading unit will be explained in detail referring to FIG. 3. The figure illustrates the case where the signal detecting one-dimentional electrode has 16 channels. The respective electrodes are connected to one signal line 123 through respective thin film transistors (hereinafter abbreviated as TFT) 122 formed on the substrate 13, i.e. the phosphor plate 41 in the structure of FIG. 2. The arbitrary on/off of the gate signal of the TFTs is possible by a TFT circuit 124 of 4 ×4 configuration formed on a different portion of the substrate 13. This TFT matrix serves as a channel controlling unit. Eight signal lines from the exterior of the substrate are used for controlling this matrix.

Figure 4A:
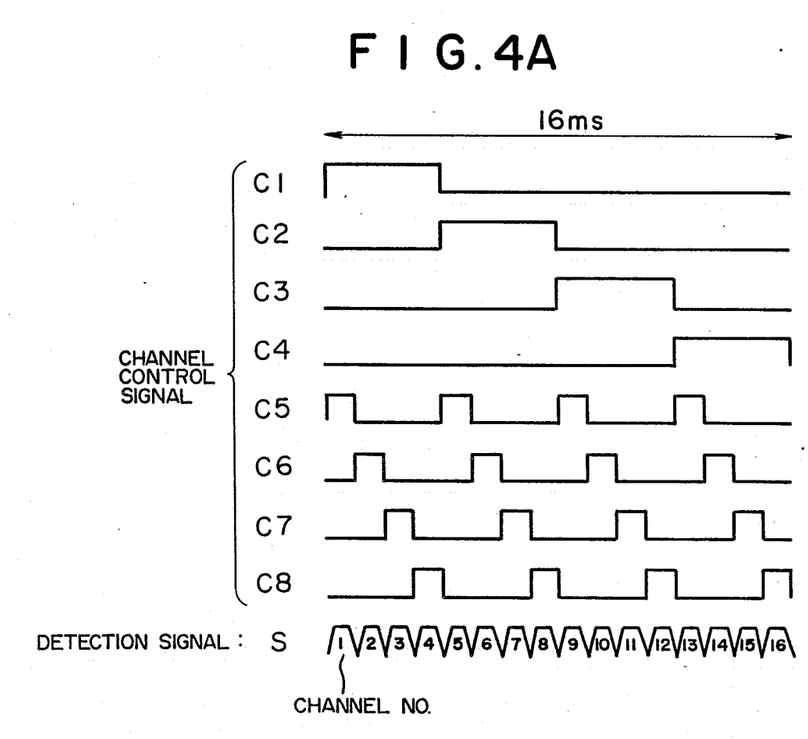
FIGS. 4A and 4B are time charts for illustrating the operation of the embodiment of FIG. 3.
Figure 4B:
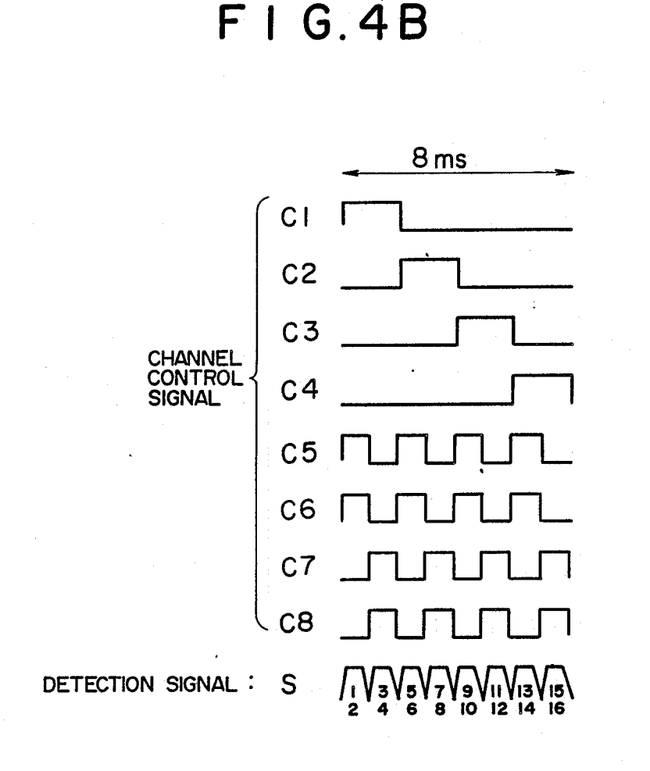

FIGS. 4A and 4B show an example of a signal deriving sequence in the present structure. FIG. 4A illustrates a mode (16 channel mode) in which the signals on 16 channel reading electrodes are successively read out channel by channel, whereas FIG. 4B illustrates 8 channel mode in which signals are read out 2-channels by 2-channels. In the latter case, the image fetching at twice the speed as that for the 16 channel mode is possible. This is a high speed low resolution image fetching. This is effective for X ray transmission diagnosis. The 16 channel mode is of low speed but has a high resolution and functions as the picture-taking mode.

Figure 5:
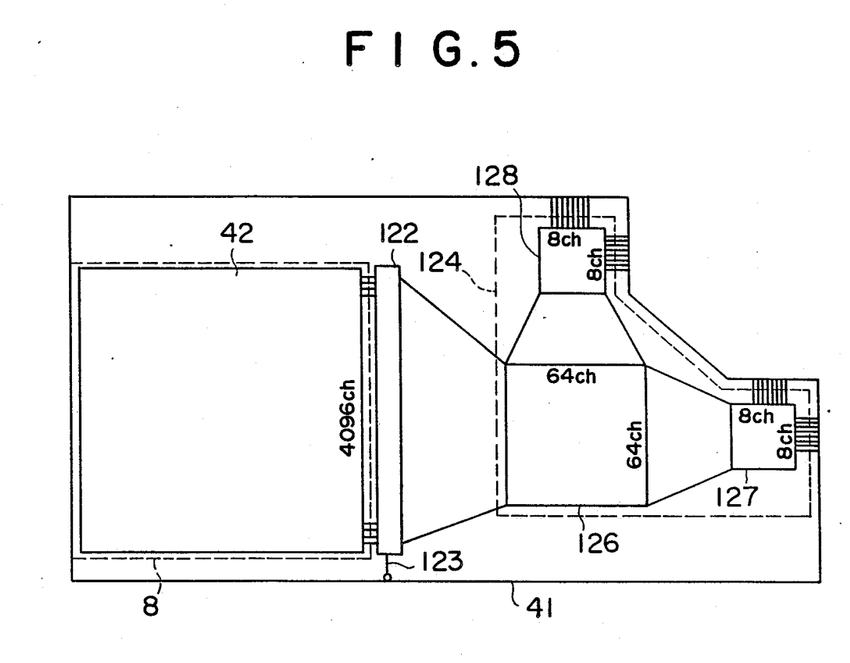
FIGS. 5, 6 and 7 are plan views respectively showing other embodiments.

FIG. 5 shows the image reading in the case of 4096 channels. A controlling TFT circuit 124 for applying control signals to the gates of 4096 selecting TFTs 122 includes a 64 ×64 matrix 126 and two 8 ×8 matrices 127 and 128 for controlling the 64 ×64 matrix. Each of these matrices has a similar structure as the matrix shown in FIG. 1. With these matrices, the control of 4096 channels can be made with 32 control lines.

Figure 6:
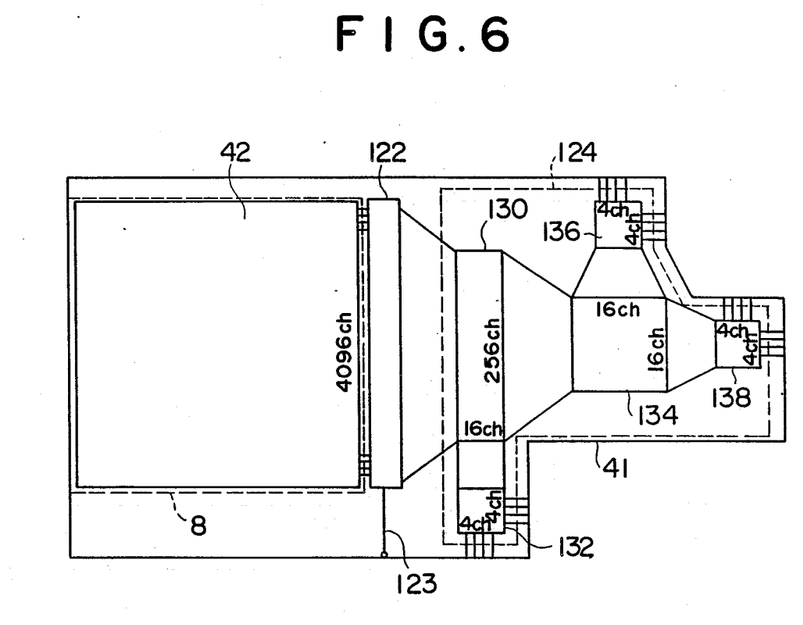

FIG. 6 illustrates another matrix disposition for the case of 4096 channels. In this case, the controlling TFT circuit for supplying control signals to the gates of 4096 selection TFTs 122 comprises a 16 ×256 TFT matrix 130, a 4 ×4 TFT matrix 132 for performing row selection of the matrix 130, a 16 ×16 TFT matrix 134 for performing column selection of the matrix 130, and two 4 ×4 TFT matrixes 136 and 138 for performing row and column selections of the matrix 134, respectively. In this structure, mode selection among fine modes of 256 channel mode, 512 channel mode, 1024 channel mode, 2048 channel mode, and 4096 channel mode, by the change in the selection sequence of the matrix 132.

Figure 7:
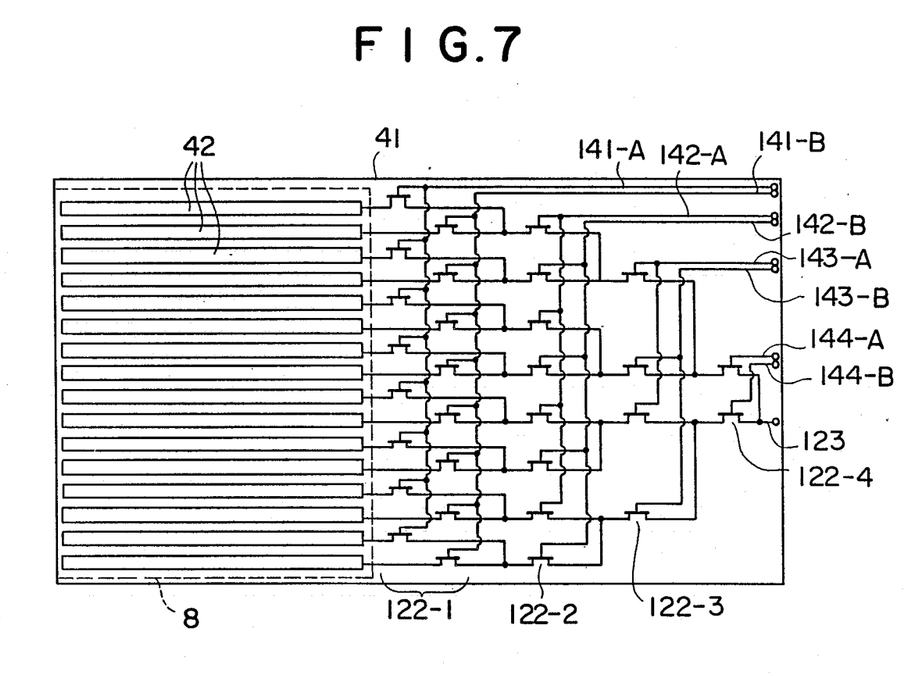

FIG. 7 illustrates another example of the selecting TFT circuit 122. This example illustrates a structure having a 16 channel reading electrode array 42, for enhancing understanding. The signals on the respective channel electrodes are connected to one signal line 123 through a first stage selection TFT column 122-1, a second stage selection TFT column 122-2, a third stage selection TFT column 122-3, and a fourth stage selection TFT column 122-4. The gates of 16 selection TFTs of the first stage are connected alternately to control lines 141A and 141B. Similarly, the gates of selection TFTs in the second stage are connected to control lines 142-A and 142-B, the gates of selection TFTs in the third stage are connected to control lines 143-A and 143-B, and the gates of selection TFTs in the fourth stage are connected to control lines 144-A and 144-B. This construction establishes a binary decoder. Selection of each one of four pairs of control lines selects one channel. Alternate selection of the respective pairs performs sequential selection of 16 channels, realizing a 16 channel mode. The successive selection of 8 channel mode can be realized by making the both of the first pair of control lines 141-A and 141-B always on and alternately selecting the remaining pairs of control lines.

Figure 8:
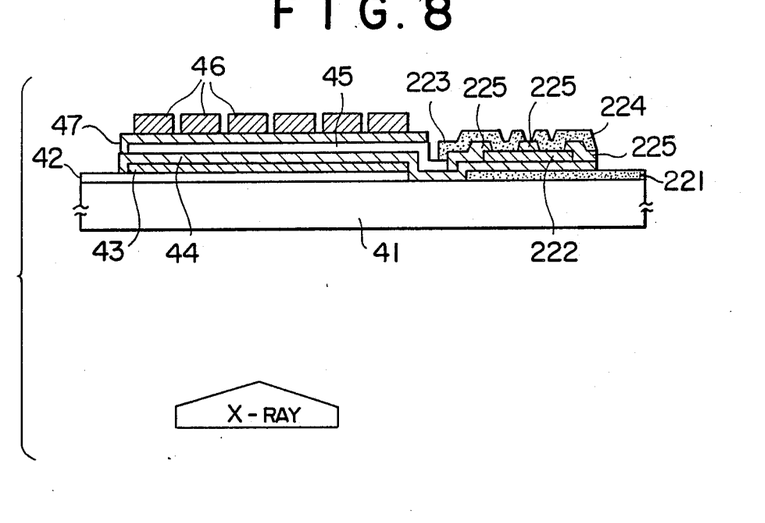
FIGS. 8 and 9 are cross-sections showing still other embodiments.

FIG. 8 shows a cross-section of the structure of another embodiment of this invention. This embodiment differs from the embodiment shown in FIG. 2 in the point that of the electrodes 42 and 45, the upper electrode 45 is divided into one-dimensional array form and the lower electrode 42 is uniform. Other reference numerals denote similar parts as in FIG. 2. Numeral 47 denotes a transparent protection film laminated on the electrode 45. Further, on a scintillator plate 41 of FIG. 8, channel designating units 10 and 12 are formed. In the figure, however, only a selecting TFT 122 of the channel designating unit 10 is shown. The TFT 122 is formed by successively laminating an Al electrode 221 which forms a gate, an insulating layer 44, and an amorphous silicon layer 222. A source electrode 223 formed of an Al layer is connected to a reading electrode 45. A drain electrode 224 similarly formed of an Al layer is connected to a signal line common to the respective channels. Numeral 225 denotes an insulating layer separating the electrodes.

Figure 9:
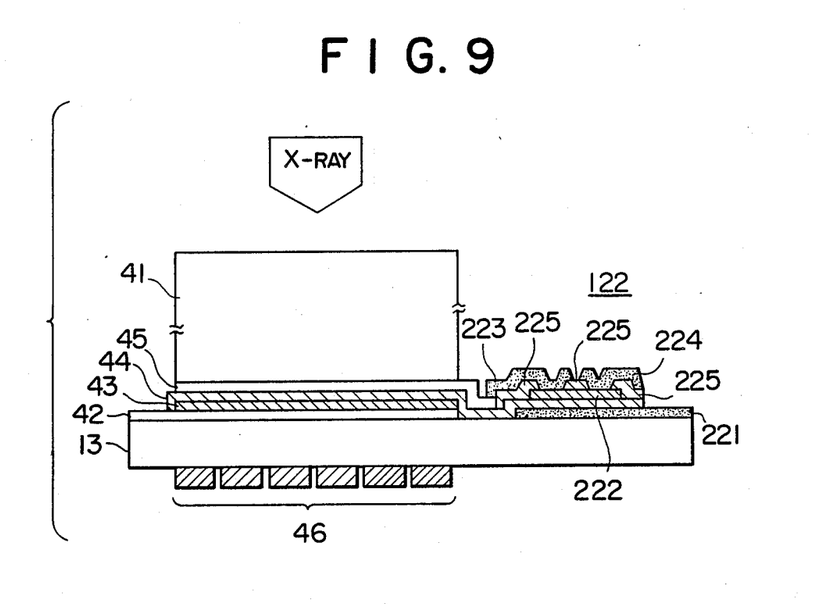

FIG. 9 shows another embodiment. In this embodiment, a scintillator plate 41 is not used as a substrate and a separate transparent substrate 13 formed of a glass plate is used. The image storing unit and TFT 122 have similar structures as those in FIG. 8, but are successively laminated on one surface of the glass substrate 13. On the electrode 45, a scintillator 41 is laminated. Further, on another surface of the glass substrate, an LED array 46 is provided.

In each of the embodiments as explained above, at least the photoconductive layer and the electrode layers sandwiching the photoconductive layer are formed on one substrate in an integrated laminate, and thin film transistors for selecting the electrode array are formed on a different region of the substrate than the region irradiated by the X-ray. It is only required for the exciting light-emitting means 46 in the structures of FIGS. 2 and 8, or the light-emitting means 46 and the phosphor plate 41 in the structure of FIG. 9, to be optically coupled with the photoconductive layer. They may not have an integrated structure.

Further, as the image storing unit, one including two phosphor layers as shown in U.S. Pat. No. 4,535,468 may be used.

We claim:
1. A radiographic image pickup apparatus comprising:
   a phosphor layer for converting a radiographic image into an optical image;
   at least one photoconductive layer optically coupled with said phosphor layer;
   a first and a second electrode sandwiching said photoconductive layer, at least one of the first and the second electrodes being divided into one-dimensional array-formed elements aligned in a first direction;
   a substrate on which at least said photoconductive layer and said first and second electrodes are integrated in one body;
   exciting light-emitting means optically coupled with said photoconductive layer, said exciting light-emitting means being divided into one-dimensional array-formed elements aligned in a second direction orthogonal to said first direction;
   selection means for selectively connecting respective elements of one of said one-dimensional array-formed elements to one signal line, wherein said selection means is formed on said substrate in a region which is not exposed to said radiographic image.

2. A radiographic image pickup apparatus according to claim 1, wherein said phosphor layer is a plate-shaped phosphor member and serves also as said substrate.

3. A radiographic image pickup apparatus according to claim 1, wherein said substrate comprises an optically trannsparent member having a first surface on which said photoconductive layer and said first electrode are laminated, and a second surface opposed to the first surface, on which said exciting light-emitting means is stacked.

4. A radiographic image pickup apparatus, according to claim 1, wherein said selection means comprises a plurality of selecting thin film transistors formed on said substrate to connect said signal line and the respective elements of said array-formed elements, and a control circuit for controlling the gates of said selecting thin film transistors.

5. A radiographic image pickup apparatus according to claim 4, wherein said control circuit includes thin film transistors disposed in a matrix, and the gate of a desired selecting thin film transistor is selected by the selection of a row line and a column line of the matrix.

6. A radiographic image pickup apparatus according to claim 1, wherein said selecting means comprises a plurality of thin film transistors for selectively connecting one signal line and at least one of said array formed elements.

* * * * *